(12) United States Patent
La Rosa

(10) Patent No.: US 7,154,325 B2
(45) Date of Patent: Dec. 26, 2006

(54) USING ACTIVE CIRCUITS TO COMPENSATE FOR RESISTANCE VARIATIONS IN EMBEDDED POLY RESISTORS

(75) Inventor: Roberto La Rosa, Phoenix, AZ (US)

(73) Assignee: STMicroelectronics, Inc., Carrollton, TX (US)

( * ) Notice: Subject to any disclaimer, the term of this patent is extended or adjusted under 35 U.S.C. 154(b) by 11 days.

(21) Appl. No.: 10/881,098

(22) Filed: Jun. 30, 2004

(65) Prior Publication Data
US 2006/0001469 A1    Jan. 5, 2006

(51) Int. Cl.
*H03L 5/00* (2006.01)
(52) U.S. Cl. .................. 327/308; 327/334
(58) Field of Classification Search .......... 327/308
See application file for complete search history.

(56) References Cited

U.S. PATENT DOCUMENTS 5,116,136 A * 5/1992 Newman et al. ............ 374/102
5,629,655 A * 5/1997 Dent ........................... 333/172
6,603,347 B1 * 8/2003 Watson ........................ 327/560
6,670,859 B1 * 12/2003 Sanduleanu .................. 331/57
6,759,729 B1 * 7/2004 Racanelli et al. ........... 257/536
2004/0263174 A1 * 12/2004 Gray et al. .................. 324/322

OTHER PUBLICATIONS

Marijan Kumric et al., "Digitally Tuneable On-Chip Line Termination Resistor For 2.5Gbits/s LVDS Receiver in 0.25μ Standard CMOS Technology".

* cited by examiner

*Primary Examiner*—My-Trang Nu Ton
(74) *Attorney, Agent, or Firm*—Lisa K. Jorgenson; William A. Munck

(57) ABSTRACT

Variations in the actual resistance of a target poly resistor in a semiconductor integrated circuit can be compensated for by using an active circuit that provides a negative resistance in parallel with the target resistor. This produces a tuned resistance that is closer to a desired resistance than is the actual resistance of the target resistor.

19 Claims, 2 Drawing Sheets

USING ACTIVE CIRCUITS TO COMPENSATE FOR RESISTANCE VARIATIONS IN EMBEDDED POLY RESISTORS

TECHNICAL FIELD OF THE INVENTION

The invention relates generally to semiconductor integrated circuits and, more particularly, to resistors in semiconductor integrated circuits.

BACKGROUND OF THE INVENTION

The unsalicided poly resistor structures provided by conventional semiconductor integrated circuit technology, such as CMOS technology, typically provide an actual resistance value that can vary +/−30% or more from the nominal resistance value of the poly resistor structure. This type of variation is not acceptable for many applications that require precision resistors, for example, the termination resistors used in LVDS and PECL applications.

In some conventional techniques, the resistance variation is compensated for by providing additional poly resistors which can be switched into or out of either series or parallel combination with a target resistor, in order to compensate for the aforementioned variation of the target resistor. In such approaches, the resistance compensation is provided in discrete amounts, and the precision of the resistance compensation can be increased by increasing the number of compensation resistors that are available for selective switching into combination with the target resistor. It is desirable in view of the foregoing to provide a capability of increasing the precision with which a target poly resistor is compensated, without requiring a corresponding increase in compensating poly resistors.

Exemplary embodiments of the invention provide for the compensation of a target poly resistor by providing an active circuit that produces a negative resistance in parallel with the target poly resistor. This permits precise compensation for variations in the resistance value of the target poly resistor, without requiring any additional poly resistors as compensating resistances.

DETAILED DESCRIPTION OF THE INVENTION

Figure 1:
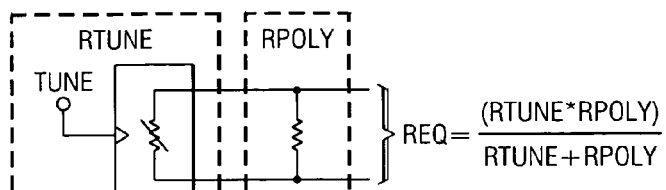
FIG. 1 conceptually illustrates a general approach utilized by the present invention to compensate a poly resistor.

FIG. 1 illustrates a general approach to compensate for variations in the resistance of an unsalicided poly resistor, such as produced by a conventional CMOS process. The poly resistor (Rpoly) of FIG. 1 can exhibit an actual resistance that varies +/−30% or more from the nominal value of the poly resistor, for example because of PVT (process, voltage, temperature) variations. This situation is well known in the art. According to the invention, a tunable compensating resistance (Rtune) is provided in parallel with the target poly resistor (Rpoly) which results in a tunable equivalent resistance (Req) defined as shown in FIG. 1. More specifically, the equivalent resistance is given by $$Req = \frac{Rtune \times Rpoly}{Rtune + Rpoly} \quad (1)$$

If the maximum variation of the poly resistor Rpoly is known, then the Rpoly can be sized, in the typical PVT conditions, lower than the desired resistance Req, so that:

$$Rpoly = Req - \left(\frac{dRpoly}{Rpoly}\right)\bigg|_{max} \times Rpoly \quad (2)$$

Because Rpoly is less than Req, the value of the resistance Rtune in FIG. 1 must be negative in order to provide the desired resistance Req. Moreover, in order to provide flexible compensation for variations in the resistance of Rpoly, the compensating resistor Rtune must be tunable (i.e., adjustable).

Figure 2:
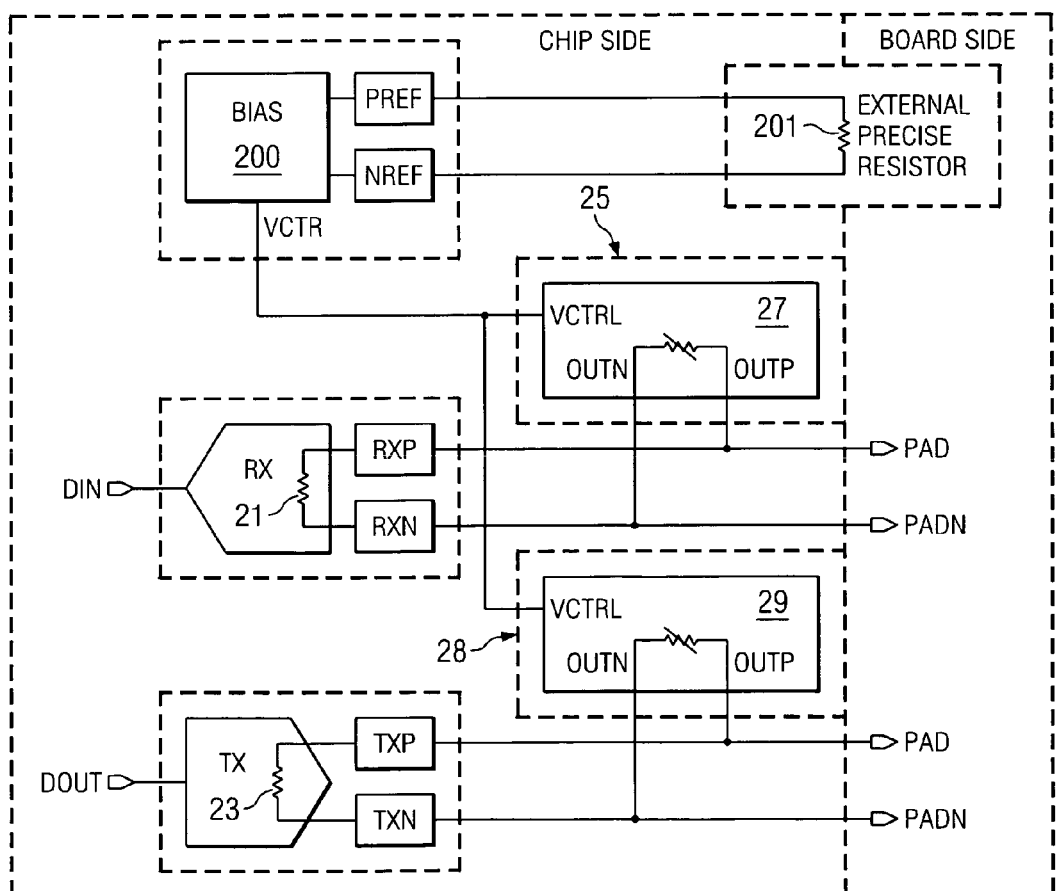
FIG. 2 diagrammatically illustrates exemplary embodiments of the present invention which utilize the approach of FIG. 1 to compensate for resistance variations in target poly resistors.

FIG. 2 diagrammatically illustrates exemplary embodiments of the present invention which provide tunable negative resistances in parallel with target poly resistors in order to compensate for variations in the target poly resistors. In the example of FIG. 2, the target poly resistors are LVDS termination resistors. As shown in FIG. 2, the target poly resistor 21 is a termination resistor for the receive (RX) LVDS path. The RX path provides input data (DIN) to a communications application (not explicitly shown). The target poly resistor 23 is the termination resistor for the transmit (TX) LVDS path. The TX path provides for transmission of output data (DOUT) received from a communications application. The TX and RX paths permit the integrated circuit (chip side) to communicate with other devices external to the integrated circuit, for example devices provided on a printed circuit board (board side). Negative resistor generators 25 and 28 are respectively provided for the target poly resistors 21 and 23. Each negative resistor generator provides, on the integrated circuit (chip side) a tunable negative resistance connected in parallel with the associated target poly resistor. For example, the negative resistor generator 25 provides a tunable negative resistance 27 connected in parallel with the target poly resistor 21 at RXP and RXN, and the negative resistor generator 28 provides a tunable negative resistance 29 connected in parallel with the target poly resistor 23 at TXP and TXN. Each of the negative resistor generators 25 and 28 receives a control signal Vctrl produced by a bias circuit 200 in cooperation with an external precision resistor 201. The external precision resistor can be provided, for example, on a printed circuit board (board side). Vctrl tunes (adjusts) the negative resistances 27 and 29 such that these negative resistances appropriately compensate for variations in the target poly resistors 21 and 23, thereby producing the desired equivalent resistance Req between the nodes PAD and PADN in both the TX and RX paths. In some embodiments, the integrated circuit of FIG. 2 is a CMOS integrated circuit.

Figure 3:
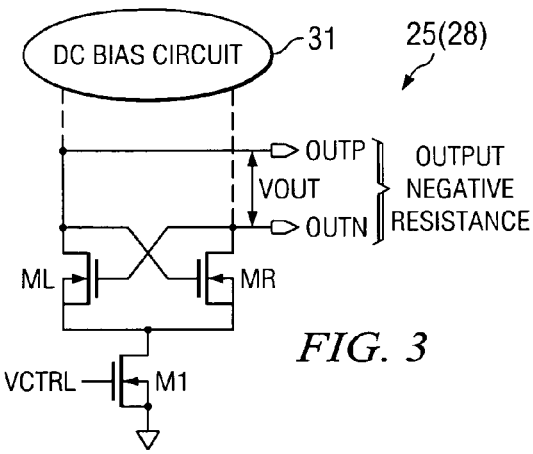
FIG. 3 diagrammatically illustrates exemplary embodiments of the negative resistor generators of FIG. 2.

FIG. 3 diagrammatically illustrates exemplary embodiments of the tunable negative resistances 27 and 29 of FIG. 2. The cross-coupled pair of transistors ML and MR builds a negative average resistance equal to −2/gm, where gm denotes the average transconductance of the two transistors ML and MR. In the example of FIG. 3, the control signal Vctrl is a control voltage which drives the gate of a further transistor M1 that is connected to the cross-coupled pair of transistors ML and MR. By varying the control voltage Vctrl, the transconductance of the transistors ML and MR is varied, thereby varying the value of the negative resistance generated between the nodes outp and outn.

The DC bias circuit 31 of FIG. 3 provides a DC bias for the transistors ML and MR. This DC bias circuit could be any circuit that provides a suitable DC bias for the transistors ML and MR. For example, the DC bias can be supplied by the fully differential LVDS IO's, which would cycle by cycle bias the nodes outp and outn at 1.2v +/−200 mv, for an average bias of 1.2 v at both nodes.

According to exemplary embodiments, the desired equivalent resistance Req is built with a parallel combination of the output resistance provided by the negative resistance generator and the target poly resistor whose variation is, for example, +/−20% over a temperature range from negative 40 to positive 120 degrees centigrade and technology parameter variation over the process corners. In one example, if the desired equivalent resistance Req is 100 ohms, then the target poly resistor is chosen such that its highest actual value will be approximately equal to the desired resistance of 100 ohms. For an example of a target poly resistor that can vary approximately +/−20%, the nominal value of the target policy resistor provided in the design will then be 80 ohms, so that the actual resistance of the target poly resistance element can vary from about 64 ohms to about 100 ohms.

The cross-coupled pair of resistors ML and MR is sized and biased in order to synthesize the correct transconductance at each PVT condition. Continuing with the example of a target poly resistor having nominal resistance of 80 ohms at the typical process corner, this 80 ohm resistance provides a transconductance of 12.5 mS, but the required transconductance is 10 mS (corresponding to the reciprocal of the desired 100 ohm resistance). Therefore, at the typical process corner, the negative resistance generator of FIGS. 2 and 3 should provide a negative conductance (−2/gm) of 2.5 mS. At the fast process corner, the target poly resistor exhibits a resistance of 64 ohms, so the negative resistance generator should provide a negative transconductance of 5.6 mS $$\left(\frac{1}{64} - \frac{1}{100}\right).$$

At the slow process corner, the target poly resistor exhibits a resistance of about 100 ohms, so negligible or no compensation is required.

As mentioned above, the cross-coupled transistor pair of FIG. 3 produces a negative average resistance equal to −2/gm, so the desired negative resistance can be adjusted as necessary by adjusting the transconductance of the transistors ML and MR. The control voltage Vctrl produced by the bias circuit 200 of FIG. 2 is utilized to set the transconductance of the transistors ML and MR to whatever value is necessary to produce the desired negative resistance between nodes outp and outn.

Figure 4:
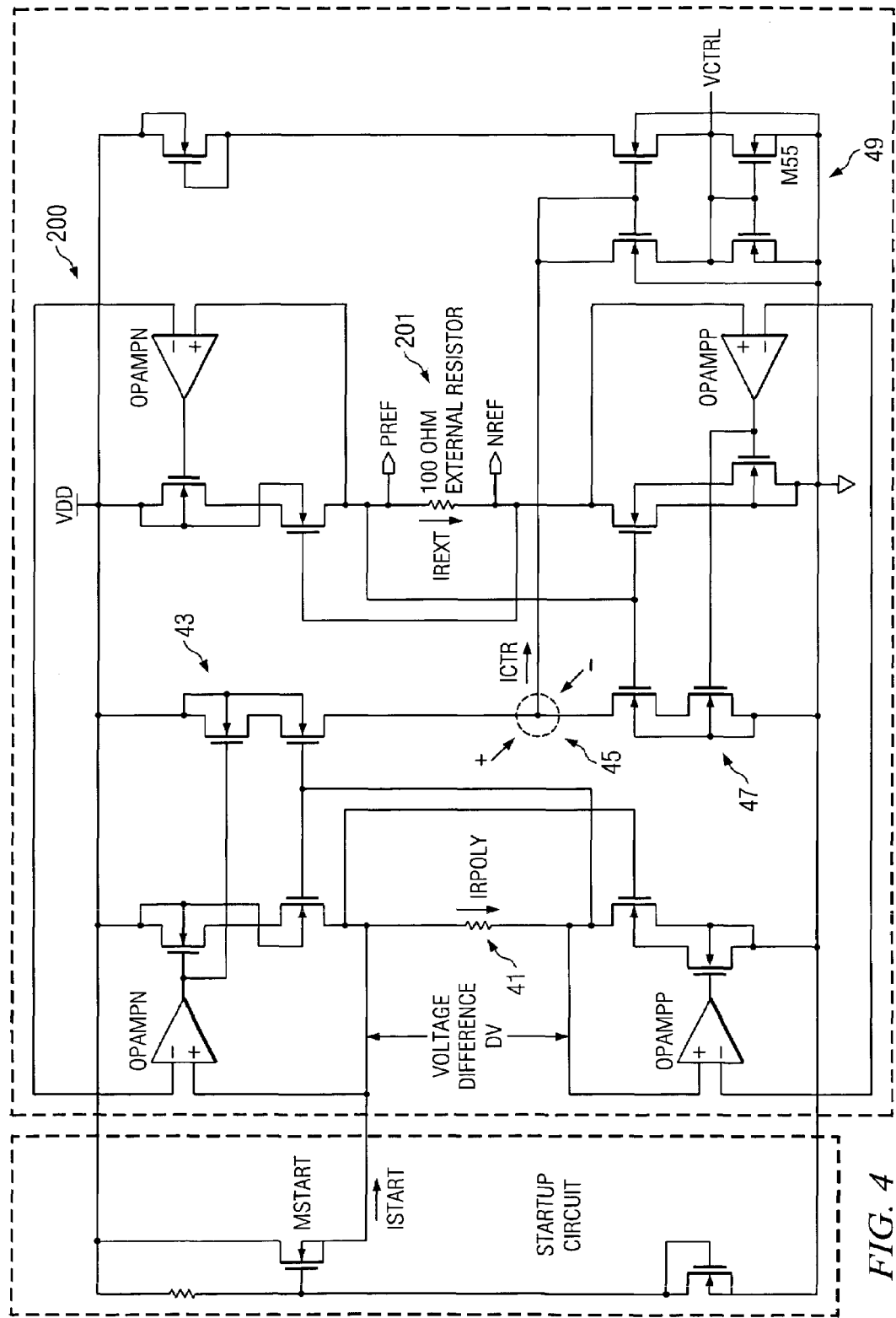
FIG. 4 diagrammatically illustrates exemplary embodiments of the bias circuit of FIG. 2.

FIG. 4 diagrammatically illustrates exemplary embodiments of the bias circuit 200 of FIG. 2, which produces the control voltage Vctrl that controls the negative resistance generator of FIGS. 2 and 3. The circuit of FIG. 4 provides the control voltage Vctrl to generate the negative resistance that is required to compensate for the target poly resistor and produce the desired resistance Req, under all PVT and operating conditions. As mentioned above with respect to FIG. 2, the bias circuit 200 cooperates with an external precision resistor 201 to produce the control voltage Vctrl. In the example of FIG. 4, the external precision resistor is a 100 ohm resistor connected between nodes PREF and NREF. The external precision resistor in FIG. 4 is thus equal to the desired resistance Req from the example given above. The bias circuit 200 of FIG. 4 includes a further poly resistor 41 having the same nominal resistance value (80 ohms in the present example) as the target poly resistors 21 and 23 of FIG. 2. The illustrated operational amplifier circuits apply a voltage difference DV across both the external precision resistor 201 and the poly resistor 41. The voltage difference DV generates respective currents in the poly resistor 41 and in the precision external resistor 201. The control voltage Vctrl produced by the bias circuit 200 is representative of the difference between the current Irpoly driven by voltage difference DV through poly resistor 41 and the current Irext driven through the external precision resistor 201 by the voltage difference DV. The current mirrors shown generally at 43 and 47 cause the difference between these currents (which also represents the difference between the resistances 41 and 201) to be produced at a current summing node 45. This node 45 sums the current Irpoly with the negative of the current Irext, in order to produce the resultant current Ictrl, that is, Ictrl=Irpoly−Irext, where Irpoly=DV/(resistance of poly resistor 41) and Irext=DV/(resistance of external resistor 201). A current mirror arrangement at 49 produces Vctrl in response to Ictrl. In particular, the transistor M55 works as a current (Ictrl) to voltage (Vctrl) transducer. With the transistors of current mirror 49 in saturation, and neglecting the channel modulation effect, the relationship is generally $$Vctrl = \sqrt{Ictrl \times L/(B \times W)} + Vth \qquad (3)$$

When the poly resistor 41 is at its minimum value (for example 64 ohms), the current Ictrl reaches its maximum. The control voltage Vctrl is produced in response to this maximum value of Ictrl so as to cause the transistors ML and MR of FIG. 3 to produce the maximum negative resistance between the nodes outp and outn. When the poly resistor 41 of FIG. 4 is at its maximum value, about 100 ohms, the respective currents through the resistors 41 and 201 are equal, so that Ictrl is practically zero, thereby producing negligible or no negative resistance between the nodes outp and outn.

The bias circuit 200 of FIG. 4 has two different equilibrium points, one in which the currents Irpoly and Irext are different than zero, and another in which these currents are zero. The later equilibrium point with both currents equal to zero is not wanted, so a startup circuit is provided in order to prevent the bias circuit 200 from reaching the unwanted equilibrium point. Assuming that the bias circuit 200 is at the unwanted equilibrium point, and that Irpoly and Irext are equal to zero, the transistor MSTART of the startup circuit will provide a current Istart through the poly resistor 41, thereby causing the circuit to move toward the desired equilibrium point in which the currents through the resistors 41 and 201 are not zero. As the circuit approaches the desired equilibrium point, the source voltage of the transistor MSTART increases, causing the current through transistor MSTART to decrease. Finally, at the equilibrium point, the transistor MSTART turns off.

It will be evident to workers in the art that the use of a negative resistance in parallel with a target poly resistor to compensate for variations in the resistance value of the target poly resistor according to exemplary embodiments of the invention is applicable to a wide variety of applications which require compensation for embedded resistors due to PVT variations in the resistance values of the embedded resistors.

Workers in the art will recognize that the use of an active circuit to provide negative resistance according to exemplary embodiments of the invention permits the desired resistance Req to be infinitely adjustable. That is, the active circuit provides a negative resistance that can be resolved in limitless fashion to whatever value is necessary to compensate for the actual value of the target poly resistor, such that the desired resistance, or a value as close as possible thereto, is produced. Therefore, in contrast to prior art techniques that utilize additional poly resistors in combination with the target poly resistor, and therefore can only adjust the resistance in discrete steps, exemplary embodiments of the present invention can provide an infinitely resolvable adjustment from the actual value of the target poly resistor to a tuned resistance value that is equal to the desired resistance Req, or at least closer to Req than is the actual value of the target poly resistor.

Although exemplary embodiments of the invention are described in detail above, this does not limit the scope of the invention, which can be practiced in a variety of embodiments.

What is claimed is:

1. A tunable electrical resistance between two nodes in a semiconductor integrated circuit, comprising:
   a first poly resistance element connected between said nodes, said first poly resistance element having associated therewith a nominal resistance value and an actual resistance that differs from said nominal resistance value; and
   an active circuit coupled to said first poly resistance element and providing a negative resistance,
   said first poly resistance element and said active circuit producing a tuned resistance between said nodes that is closer than said actual resistance to a desired resistance that is desired between said nodes.

2. The tunable electrical resistance of claim 1, wherein said nominal resistance value is less than said desired resistance.

3. The tunable electrical resistance of claim 2, wherein said active circuit permits a difference between said actual resistance and said tuned resistance to have a continuously resolvable value.

4. The tunable electrical resistance of claim 1, wherein said active circuit permits a difference between said actual resistance and said tuned resistance to have a continuously resolvable value.

5. The tunable electrical resistance of claim 1, wherein wherein a difference between said actual resistance and said nominal resistance value results from a fabrication process used to produce said first poly resistance element.

6. The tunable electrical resistance of claim 5, wherein said fabrication process is a CMOS process.

7. The tunable electrical resistance of claim 1, wherein wherein a difference between said actual resistance and said nominal resistance value results from sensitivity to one of a power supply voltage and a temperature at which said semiconductor integrated circuit is operated.

8. The tunable electrical resistance of claim 1, wherein said active circuit includes a pair of cross-coupled transistors, said cross-coupled transistors producing said negative resistance in response to a control signal.

9. The tunable electrical resistance of claim 8, wherein said control signal is a voltage signal.

10. The tunable electrical resistance of claim 8, wherein said active circuit includes a control producing said control signal, said control circuit including a second poly resistance element, said control circuit adapted for connection to a reference resistor, and said control signal indicative of a difference between an actual resistance of said second poly resistance element and a resistance of said reference resistor.

11. The tunable electrical resistance of claim 1, wherein said nodes are for carrying low voltage differential signaling (LVDS) communication.

12. A method of forming a tunable electrical resistance between two nodes in a semiconductor integrated circuit, the method comprising:
    forming a first poly resistance element connected between said nodes, wherein said first poly resistance element has an actual resistance that differs from a nominal resistance value for said first poly resistance element; and
    coupling an active circuit to said first poly resistance element between said nodes, said active circuit providing a negative resistance,
    said first poly resistance element and said active circuit, when operable, producing a tuned resistance between said nodes that is closer than said actual resistance to a desired resistance desired between said nodes.

13. The method of claim 12, wherein said nominal resistance value is less than said desired resistance.

14. The method of claim 12, wherein said active circuit permits a difference between said actual resistance and said tuned resistance to have a continuously resolvable value.

15. The method of claim 12, further comprising:
    providing a control circuit including a second poly resistance element and selectively connected to a reference resistor, said control circuit producing a control signal indicative of a difference between an actual resistance of said second poly resistance element and a resistance of said reference resistor, and
    employed to control said negative resistance provided by said active circuit.

16. A method of operating a tunable electrical resistance between two nodes in a semiconductor integrated circuit, the method comprising:
    applying an electrical signal to
    a first poly resistance element connected between said nodes, wherein said first poly resistance element has an actual resistance that differs from a nominal resistance value for said first poly resistance element, and
    an active circuit coupled to said first poly resistance element between said nodes and providing a negative resistance; and
    producing a tuned resistance between said nodes that is closer than said actual resistance to a desired resistance desired between said nodes.

17. The method of claim 16, wherein said nominal resistance value is less than said desired resistance.

18. The method of claim 16, wherein said active circuit permits a difference between said actual resistance and said tuned resistance to have a continuously resolvable value.

19. The method of claim 16, further comprising:
    connecting a reference resistor to a control circuit including a second poly resistance element;

producing a control signal indicative of a difference between an actual resistance of said second poly resistance element and a resistance of said reference resistor; and controlling said negative resistance based upon said control signal.

* * * * *